June 3, 1969 A. BERENBAUM ET AL 3,447,386

TUNING MECHANISM

Filed Oct. 25, 1967

INVENTORS
ARTHUR BERENBAUM
RUFUS F. SHELBY
BY
Harry W. Hargis III
AGENT

United States Patent Office 3,447,386
Patented June 3, 1969

3,447,386
TUNING MECHANISM

Arthur Berenbaum, Holland, and Rufus F. Shelby, Philadelphia, Pa., assignors to Philco-Ford Corporation, Philadelphia, Pa., a corporation of Delaware Filed Oct. 25, 1967, Ser. No. 677,977
Int. Cl. F16h *35/18*
U.S. Cl. 74—10.8 9 Claims

ABSTRACT OF THE DISCLOSURE

A preset UHF tuning mechanism including twenty-four detented positions covering the 70 UHF channels, and means operable automatically in each such position to select a desired one of a group of channels assigned to that position. The UHF tuner is driven by a detented tuner knob through a pair of meshed helical gears. Adjustable positioning means, presettable for each of the 24 detented positions, imparts limited axial movement to one helical gear relative to the other, with consequent fine rotary adjustment of the tuner to select the desired UHF channel of a detented group.

BACKGROUND OF THE INVENTION

This invention relates to tuning mechanisms, and more particularly to improvements in preset tuning mechanisms for electronic tuners. While of broader applicability, the invention has particular utility in the field of UHF tuners as used in television receivers.

In view of the increasing number of UHF channels in use, it has become desirable to provide step or detented tuning of these channels, as is provided for the VHF channels. Inasmuch as it is now necessary to provide for 70 UHF channels on a single rotary tuner, the provision of detented tuning has presented problems. One solution has been to provide a lesser number of detented positions each of which accommodates a group of several UHF channels, with means provided for selective fine tuning of any desired channel in the selected group. Since in any one broadcast area there generally exists only one channel in each group of several, fine tuning of all channels is an unnecessary nuisance. The answer has been to provide preset fine tuning means for the UHF channels. Heretofore such means have comprised intricate linkages that are both costly and difficult to manufacture. It is a general objective of this invention to provide improved mechanical drive and linkage means for the preset fine tuning of a UHF tuner, which means is both inexpensive and easy to manufacture.

SUMMARY OF THE INVENTION

In achievement of this general objective, the invention contemplates, in a preferred embodiment thereof, an improved preset UHF tuning mechanism comprising a first shaft, a rotatable tuner on said shaft, a first helical gear on said shaft and keyed thereto for both rotation therewith and axial movement thereon, and means defining a generally spherical surface drivingly associated with said said first helical gear. A second helical gear is arranged to mesh with the first gear, and a second shaft is provided for manually rotating the second gear. A wheel is driven with the first shaft and carries circumferentially spaced, axially extending adjustable follower elements positioned sequentially to engage the spherical surface of the first helical gear, with consequent axial movement of the latter relative to the second gear upon each such engagement. Axial movement of the first helical gear causes it to be moved rotatably with respect to the second gear, with which it is meshed. This relative rotation of the first gear achieves the preset fine tuning rotation of the tuner.

For a more complete understanding of the invention, and of the preferred manner for achieving the foregoing as well as other objectives, reference is made to the following description taken in light of the accompanying drawing.

DESCRIPTION OF THE PREFERRED EMBODIMENT

Figure 1:
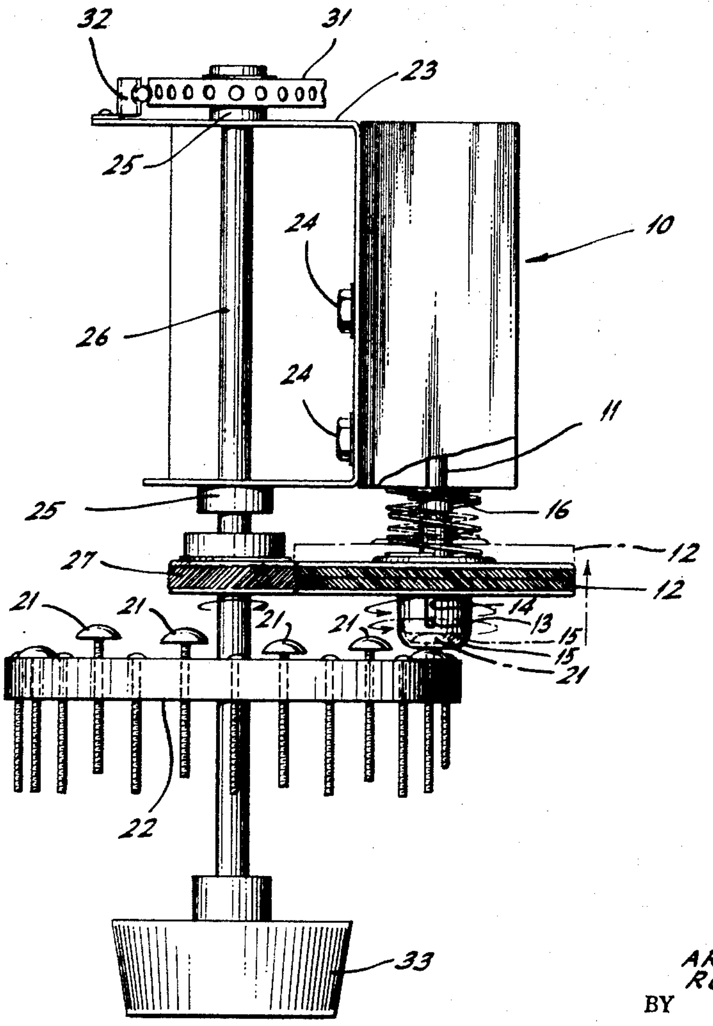
FIGURE 1 is a side view of UHF tuning apparatus embodying the invention, and with parts broken away.

With more detailed reference to the drawing, there is illustrated in FIGURE 1 a UHF tuner 10 of well-known type preferably including infinitely variable tuning condensers (not shown) carried by rotatable tuning shaft 11. A helical gear 12 is keyed for rotation with shaft 11 by interengagement of a pin 13 extending through the shaft 11 and through a slot 14 extending axially along hub 15 of gear 12. In particular accordance with the invention helical gear 12 is not only rotatable to drive shaft 11, but also is slidable along shaft 11 by virtue of the above described pin and slot connection. A coiled compression spring 16 reacts between the tuner housing and the axially slidable gear 12 to maintain a dome-shaped central portion of gear hub 15 in abutting engagement with one of a plurality of followers 21 on a wheel 22, hereinafter to be more fully described.

A U-shaped bracket 23 is mounted on a wall of the tuner body, for example by screws 24, and includes bearing means 25 for supporting another rotatable shaft 26 to which wheel 22 is keyed for rotation. A helical gear 27 also is keyed for rotation with shaft 26 and is meshed with the other helical gear 12. A detent ring 31 is carried by shaft 26 and is engageable by a resiliently supported detent member 32 to provide for a plurality of detented positions of the tuner shaft 11. While in the present embodiment it has been found convenient to provide 24 dented positions, as are illustrated diagrammatically in FIGURE 2, it will be understood from the ensuing description that other suitable divisions of detented positions may be resorted to.

A knob 33 is fixed to shaft 26 and provides for manual rotation of the tuner shaft 11 through helical gears 12 and 27, and in increments corresponding to the detented positions. A follower 21 is provided for each such detented position of the shaft 26, each follower 21 being adjustably positioned by means of a shank portion threaded into wheel 22.

The construction and arrangement is such that as wheel 22 is rotated, for example by turning knob 33 to rotate shaft 26 and gear 27 to the right as indicated by the solid line directional arrow, followers 21 are moved slidably and sequentially to engage the central, dome-shaped portion of gear hub 15 for each detented position of shaft 26. Rotation of gear 27 to the right will rotate gear 12 to the left as indicated by the solid line rotational arrow applied adjacent thereto. Since in each detented position shaft 26 and helical gear 27 are locked against rotation, the axial movement of helical gear 12 under the urging of follower 21 against hub 15, indicated by the broken line directional arrow, is accompanied by slight rotational movement of gear 12 and tuner shaft 11, as is indicated by the broken line rotational arrow. It is this slight rotational movement that provides the desired fine tuning.

Figure 2:
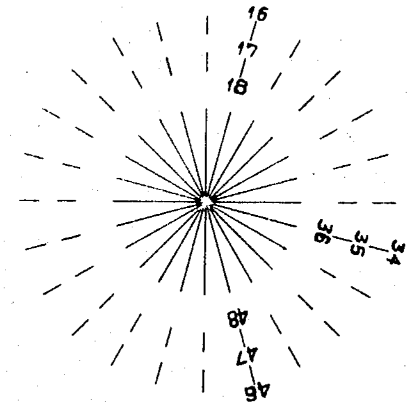
FIGURE 2 is a diagram illustrative of operational features of the apparatus seen in FIGURE 1.

With additional reference to FIGURE 2, and further by way of example, the 24 detented positions cover the UHF band comprising 70 channels. For convenience of illustration, only three groups of channels are labelled, and each such group includes one channel to which the apparatus under consideration is to be tunable. For example, it is assumed that the apparatus is located in such a region that it is necessary to tune UHF channels 17, 35, and 48 within their respective groups. Three channels are allocated to all but two of the 24 detented positions, and two channels are allocated to each of the remaining two detented positions. The possibility of allocating different numbers of channels to each detented position is of course contemplated by the invention. However, in the present embodiment it is preferred to provide 24 detented positions spaced 15° apart. A 2:1 gear ratio is preferred, so that the tuner shaft turns about 7.5° for each detented position to cover a band pass of three channels (18 megacycles).

To preset the tuner, knob 33 is rotated to move tuner shaft 11 to a detented position where the desired channel can be located. The channel presetting screw is turned thereafter to move the follower 21, with the consequent hereinabove-described axial and rotational movement of helical gear 12, to move tuner shaft 11 until the desired channel of a detented group is tuned. A number of known linkage means are suitable for presetting followers 21. For example, the ends of the threaded portions of followers 21 may be provided with slots presented at an opening in cabinet structure housing the tuner and engageable by a screwdriver or the like to adjust the follower. Alternatively, threaded portions of followers 21 may be provided with gears releasably engaged by known push-to-engage knob-and-gear mechanism.

It will be appreciated that once the tuner has been preset for each of the preselected channels in the above described manner subsequent tuning of a desired one of these channels is achieved automatically merely by rotating the tuner knob to the corresponding detented position. Indication of the fine-tuned channels may be provided by known indicator means rotatable with one of the rotating shafts 11 and 26. For example, an indicator disk may be provided with only those numbers corresponding to the UHF channels available in a specified viewing area.

It will be appreciated from the foregoing description that the present invention provides improved mechanical drive and linkage means for the preset fine tuning of a UHF tuner, which means is both inexpensive and easy to manufacture.

We claim:

1. Detented presettable tuning mechanism comprising a pair of shafts, rotatable tuning means driven by one of said shafts, means for imparting rotation to the other of said shafts, a pair of gear means rotatable with said shafts and disposed in meshed relation whereby rotation imparted to the other shaft will cause the recited one shaft, and consequently the tuning means, to be rotated, the gear means associated with said one shaft being coupled thereto for combined slidable and rotational movement along its shaft while meshed with the other gear means, means for detenting said other shaft and thereby said tuning means at a plurality of predetermined angularly spaced positions in the achievement of coarse tuning of said tuning means, and presettable means operable, upon detent-positioning of said tuning means, axially to move the recited one gear means relative to the other to induce the recited relative rotational movement of said gear means in achievement of fine tuning of said tuning means.

2. Mechanism according to claim 1, and characterized in that each said gear means is of the helical type and in that a pin and slot coupling provides the recited slidable movement of the gear means associated with said one shaft, whereby to achieve the combined slidable and rotational movements.

3. Mechanism according to claim 2, and further characterized in that the presettable means operable axially to move the one gear means comprises a central cam surface on said one gear means and rotatable cam follower means driven with said other shaft and engageable with said cam surface to impart the recited axial movement to said one gear means.

4. Mechanism according to claim 3, and further characterized in that said cam follower means comprises a plurality of angularly spaced follower elements mounted for adjustable positioning toward and away from said central cam surface in provision of varying degrees of the recited fine tuning.

5. Detented presettable tuning mechanism comprising a pair of shafts, rotatable tuning means driven by one of said shafts, means for imparting rotation to the other of said shafts, a pair of helical gears rotatable with said shafts and disposed in meshed relation whereby rotation imparted to the recited other shaft will cause the recited one shaft, and consequently the tuning means, to be rotated, the helical gear associated with said one shaft further being slidable axially of its shaft while meshed with the other helical gear, means for detenting said other shaft and thereby said tuning means at a plurality of predetermined angularly spaced positions in the achievement of coarse tuning of said tuning means, and presettable means operable, upon detent-positioning of said tuning means, axially to move the recited one gear relative to the other whereby to induce relative rotational movement of said helical gears in achievement of fine tuning of said tuning means.

6. Mechanism according to claim 5, and characterized in that said last recited means comprises a generally dome-shaped cam surface on said one gear, and wheel means driven with said other shaft and including a plurality of cam follower means rotatable thereby and sequentially engageable with said cam surface to impart the recited axial movement to said one gear.

7. Mechanism according to claim 6, and further characterized in that said cam follower means are adjustable toward and away from said cam surface in provision of varying degrees of the recited fine tuning rotation.

8. Mechanism according to claim 7, and further characterized in that said one helical gear is keyed to a shaft as recited by means of a pin and slot connection.

9. Detented presettable tuning mechanism comprising a first shaft, rotatable tuning means on said shaft, a first helical gear on said first shaft and keyed both for rotation therewith and axial movement therealong, a generally dome-shaped member coaxial with said first helical gear, a second helical gear arranged to mesh with the first gear, a second shaft for manually rotating said second gear, a wheel driven with said first shaft and carrying circumferentially spaced, axially extending adjustable follower elements positioned sequentially to engage said dome-shaped member, thereby axially to move said first helical gear upon each such engagement, such movement causing said first helical gear to be moved rotatably with respect to the recited second gear with which it is meshed, thereby to move said tuner shaft in achievement of preset fine tuning rotation of said tuning means.

References Cited

UNITED STATES PATENTS 3,188,871 6/1965 Mentzer ---------------- 74—10

MILTON KAUFMAN, *Primary Examiner.*

U.S. Cl. X.R.

74—10.6